United States Patent
Jung

(10) Patent No.: US 6,949,947 B2
(45) Date of Patent: Sep. 27, 2005

(54) TEST MODE CIRCUIT OF SEMICONDUCTOR DEVICE

(75) Inventor: Ho Don Jung, Gyeonggi-do (KR)

(73) Assignee: Hynix Semiconductor Inc., (KR)

( * ) Notice: Subject to any disclaimer, the term of this patent is extended or adjusted under 35 U.S.C. 154(b) by 0 days.

(21) Appl. No.: 10/745,280

(22) Filed: Dec. 23, 2003

(65) Prior Publication Data
US 2005/0138502 A1  Jun. 23, 2005

(30) Foreign Application Priority Data
Nov. 13, 2003 (KR) ...................... 10-2003-0080045

(51) Int. Cl.$^7$ .......................................... G01R 31/28
(52) U.S. Cl. ........................ 326/16; 326/38; 714/734
(58) Field of Search .......................... 326/16, 38, 82; 714/724, 734

(56) References Cited

U.S. PATENT DOCUMENTS

| | | | |
|---|---|---|---|
| 4,707,620 A * | 11/1987 | Sullivan et al. ............... | 326/86 |
| 4,958,324 A | 9/1990 | Devin | |
| 5,208,777 A | 5/1993 | Shibata | |
| 5,357,193 A | 10/1994 | Tanaka et al. | |
| 5,452,253 A | 9/1995 | Choi | |
| 5,502,399 A | 3/1996 | Imai | |
| 5,544,063 A * | 8/1996 | Zanders et al. ............... | 702/65 |
| 5,563,546 A | 10/1996 | Tsukada | |
| 5,717,935 A * | 2/1998 | Zanders et al. ............. | 713/300 |
| 5,930,188 A | 7/1999 | Roohparvar | |
| 6,055,028 A | 4/2000 | Nishi et al. | |
| 6,301,168 B1 | 10/2001 | Crocker | |

FOREIGN PATENT DOCUMENTS

| | | |
|---|---|---|
| JP | 1052298 | 2/1989 |
| JP | 5281302 | 10/1993 |
| JP | 7078500 | 3/1995 |

\* cited by examiner

Primary Examiner—Daniel D. Chang
(74) Attorney, Agent, or Firm—Marshall, Gerstein & Borun LLP

(57) ABSTRACT

Provided is a test mode circuit of a semiconductor device comprising: a test mode control unit for generating a test mode control signal which is decoded in response to a plurality of address codes corresponding to kinds of test modes, respectively; a multi-level generating unit for generating multi levels; a multi-level transfer unit for loading the multi levels on one multi-level test mode line in response to a control signal from the test mode control unit; and a multi-level identifying unit for identifying the multi levels to be inputted from the multi-level transfer unit, to supply a generated test signal to a test mode utilizing circuit.

9 Claims, 5 Drawing Sheets

TEST MODE CIRCUIT OF SEMICONDUCTOR DEVICE

BACKGROUND

1. Field of the Invention

The present invention relates to a test mode circuit of a semiconductor device and, more specifically, to a test mode circuit of a semiconductor device capable of reducing the number of test lines.

2. Discussion of Related Art

In general, a yield falls off due to a trend toward a high-capacity semiconductor memory, the possibility that inner defects of a chip are generated is increased due to an increase of a chip area, and the possibility that one or more wires are connected to one defect is highly increased due to a decrease of space between wires by fineness thereof. Specifically, in manufacturing a memory semiconductor integrated circuit, which has field effect transistors (FETs) as main elements, characteristics of the respective layers of the semiconductor integrated circuit are tested in the course of manufacture thereof to guarantee operation of the semiconductor integrated circuit. However, it costs a great deal to test the characteristics of the semiconductor integrated circuit in the course of manufacture of the semiconductor integrated circuit, and a ratio of the test cost to the whole manufacture cost is not negligible. Most of the test cost is expenses for using test devices, and depreciation cost and incidentals are also included in the test cost.

Also, the test time gets increased with enhancement of the degree of integration. But, at present, in order to enhance the manufacture reliability, an increase of the test time is prevented by lowering the degree of integration to reduce test dependency of the product reliability.

In view of such situations, it is a long-range goal in the related art to reduce the test cost, and various kinds of methods are examined for the purpose thereof. For example, a plurality of parallel tests are executed to reduce equipment cost, and in this case, high incidental expenses are not only required, but also an expensive high-speed tester is required.

One control circuit and one test line are used for one test item in a case where a DRAM uses a test mode. As a result, the test lines should be arranged in the limited area in designing the layout. Therefore, addition of a test item causes increases of lines in a full chip area.

The conventional method will be explained with reference to FIGS. 1 to 3.

A test mode control unit 10 is connected to a test mode utilizing unit 30 such as a voltage level control circuit or a pulse width control circuit through a test mode line 20. The test mode control unit 10 comprises a plurality of decoders 40a to 40n as shown in FIG. 2. In a state where a test start signal Test_start is enabled, when address codes Add<0> to Add<n> which are predetermined corresponding to items to be tested are inputted, output signals of the decoders 40a to 40n corresponding to the input address codes are changed to a high state from a low state. As a result, the test mode signals Test_mode<0> to Test_mode<n> are generated. The test mode signals are inputted to the test mode utilizing unit 30 through the corresponding test mode lines, and a checking signal Check_signal is inputted to test mode identifying units 50a to 50n.

According to the conventional method, there is a problem that the chip area is increased because one test mode line is required for one test mode as described above.

SUMMARY OF THE INVENTION

In order to solve the above problems, the present invention is directed to a test mode circuit of a semiconductor device capable of reducing the number of test mode lines in using a test mode by loading a plurality of bias levels on one test mode line and allowing respective bias levels to be recognized as one test mode.

Therefore, the present invention provide a test mode circuit of a semiconductor device, comprising: a test mode control unit for generating a test mode control signal which is decoded in response to a plurality of address codes corresponding to kinds of test modes, respectively; a multi-level generating unit for generating multi levels; a multi-level transfer unit for loading the multi levels on one multi-level test mode line in response to a control signal from the test mode control unit; and a multi-level identifying unit for identifying the multi levels input from the multi-level transfer unit to supply a generated test signal to a test mode utilizing circuit.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Now, the preferred embodiments of the present invention will be described in detail with reference to the accompanying drawings.

Figure 1:
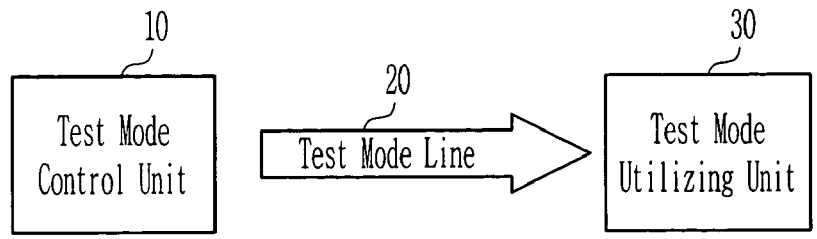
FIG. 1 is a block diagram illustrating a conventional test mode.
Figure 2:
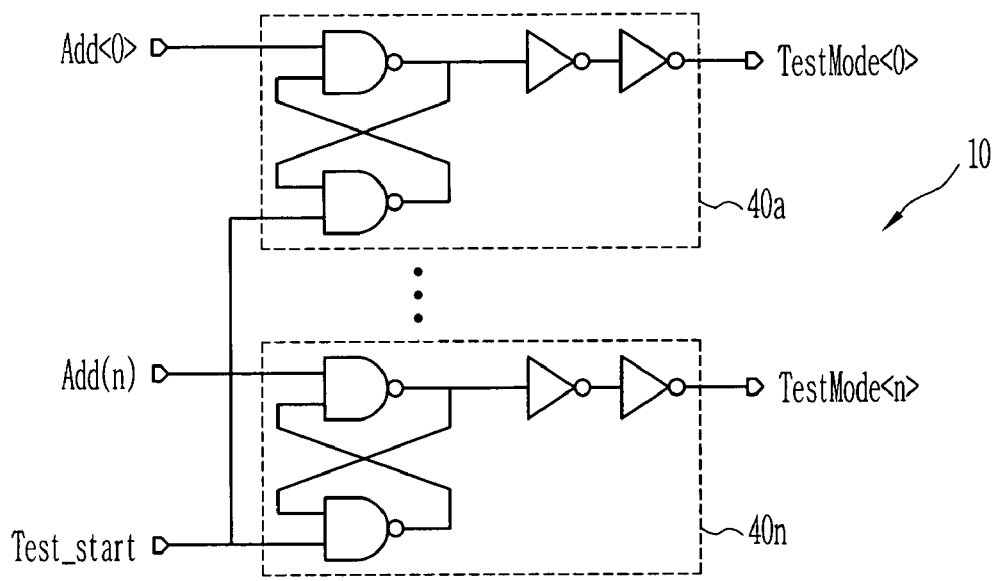
FIG. 2 is a detailed circuit diagram of a test mode control unit in FIG. 1.
Figure 3:
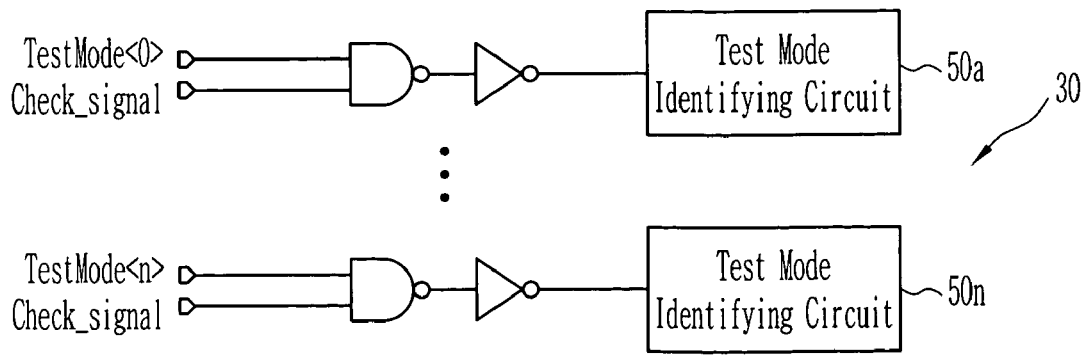
FIG. 3 is a detailed circuit diagram of a test mode utilizing unit in FIG. 1.
Figure 4:
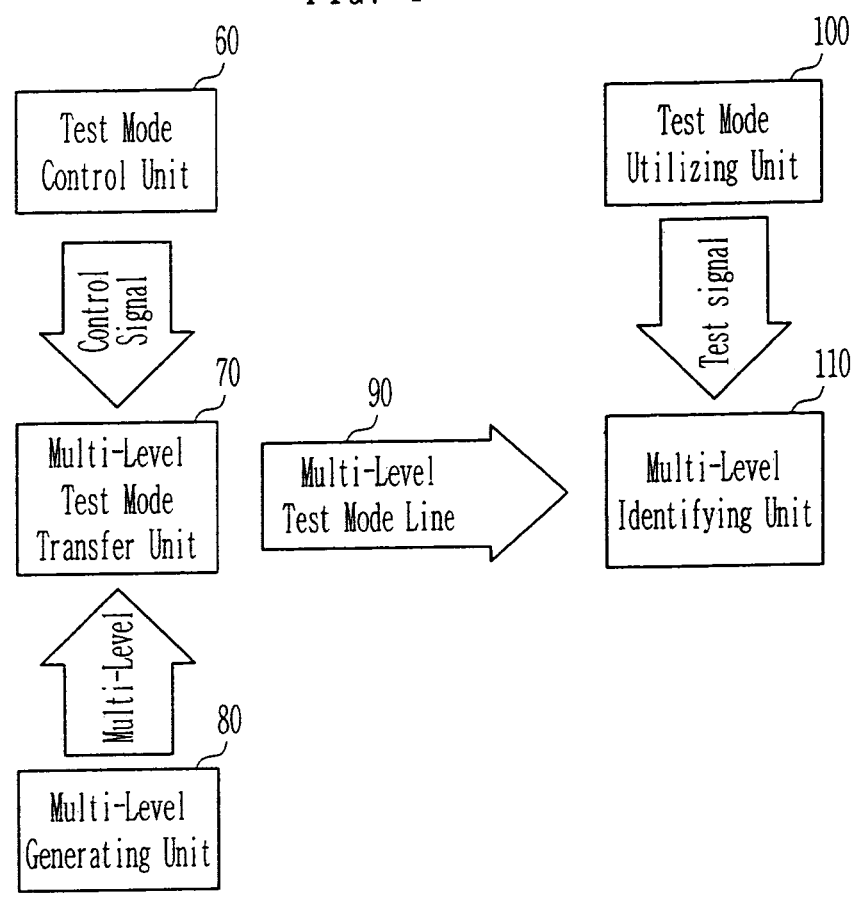
FIG. 4 is a block diagram illustrating a test mode circuit according to the present invention.

FIG. 4 is a block diagram illustrating a test mode circuit of a semiconductor device according to the present invention. A plurality of address codes corresponding to kinds of items to be tested, that is, test modes are set up. A control signal, which is decoded in response to the address codes, is generated in a test mode control unit 60, and then transferred to a multi-level test mode transfer unit 70.

A plurality of multi levels are generated in a multi-level generating unit 80 by using various methods such as a resistance divider, and so on.

A multi-level transfer unit 70 loads the multi levels on a multi-level test mode line 90 in accordance with the control signal of the test mode control unit 60.

A multi-level identifying unit 110 comprises, for example, comparators, and identifies the multi level to be input. The test mode utilizing circuit 100 is operated in accordance with output of the multi-level identifying unit 110 or its coded signal.

Now, the preferred embodiments of the present invention will be described in more detail with reference to FIGS. 5 to 10.

Figure 5:
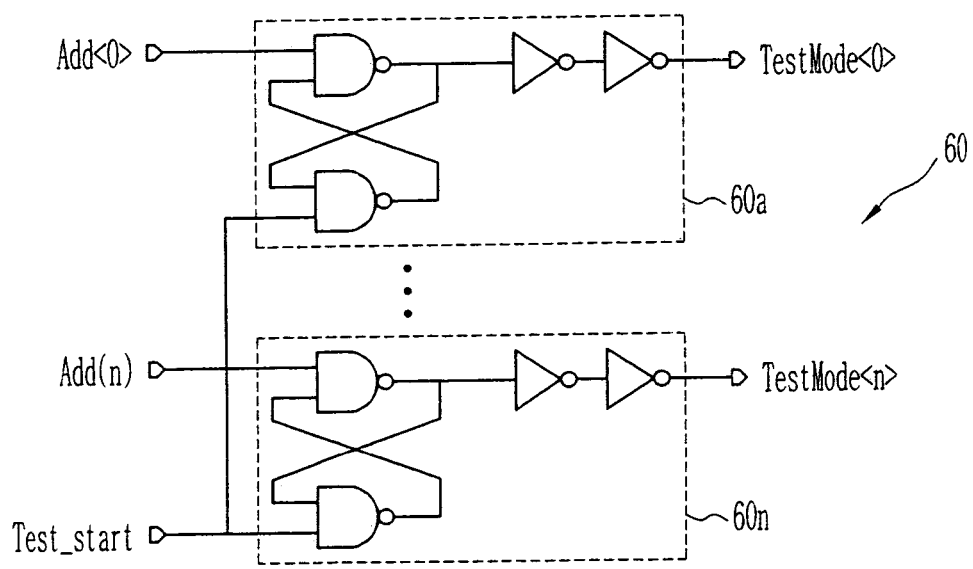
FIG. 5 is a detailed circuit diagram of a test mode control unit in FIG. 4.

FIG. 5 is a detailed circuit diagram of the test mode control unit 60 in FIG. 4.

The test mode control unit 60 comprises a plurality of latches 60a to 60n. Output signal of the latches are outputted via two inverters connected in series. As a result, a plurality of test mode control signals TestMode<0> to TestMode<n> are generated.

Figure 6:
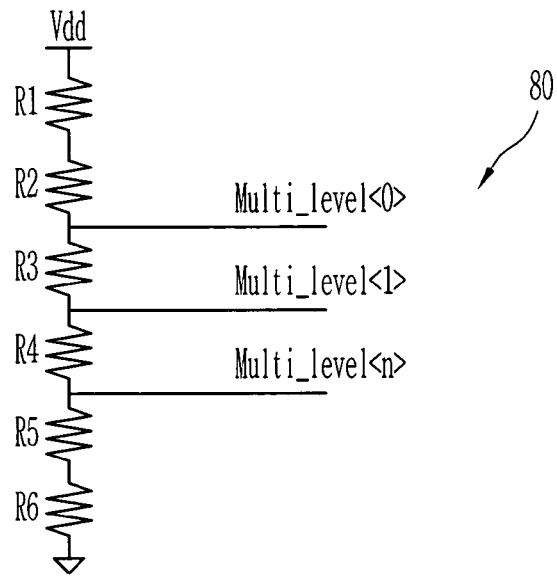
FIG. 6 is a detailed circuit diagram of a multi-level generating unit in FIG. 4.

FIG. 6 is a detailed circuit diagram of the multi-level generating unit in FIG. 4.

As shown in FIG. 6, multi levels may be generated by the resistance divider comprising a plurality of resistors R1 to R6 connected in series, or may be generated through various methods using a down level in use for other purpose in the semiconductor device.

Figure 7:
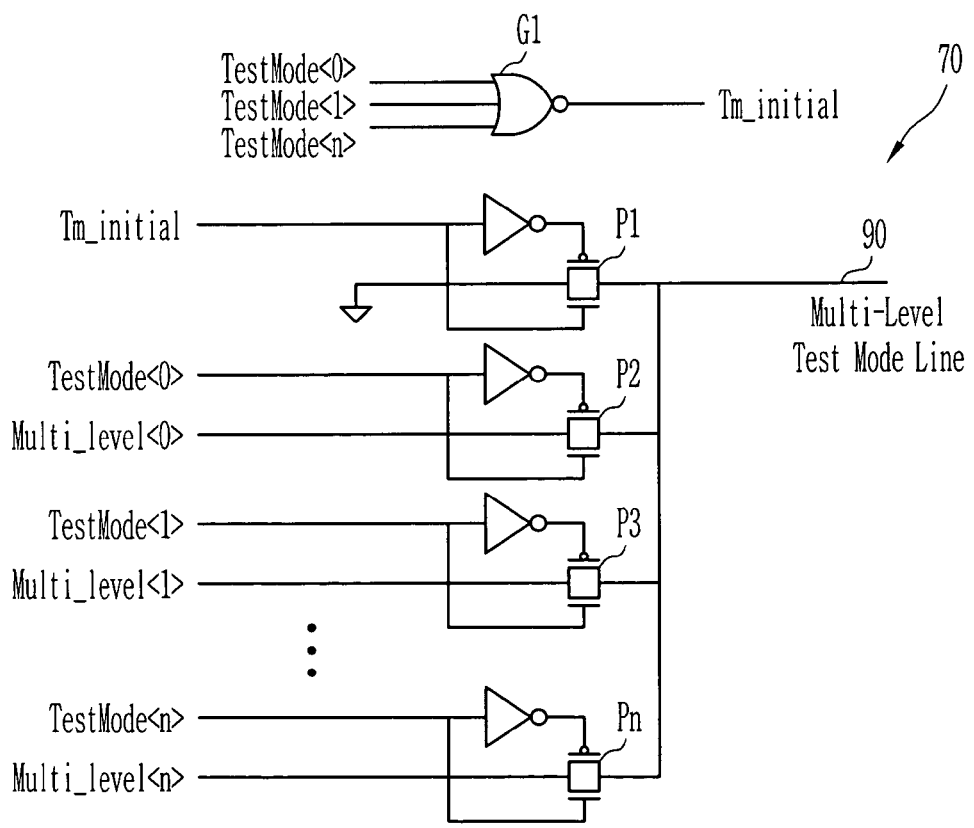
FIG. 7 is a detailed circuit diagram of a multi-level test mode transfer unit in FIG. 4.

FIG. 7 is a detailed circuit diagram of the multi-level test mode transfer unit 70 in FIG. 4.

Outputs of the test mode control unit 60 of FIG. 5 TestMode<0>, TestMode<1>, . . . . TestMode<n> are inputted to a NOR gate G1. Here, an output of the NOR gate G1 is used as an initial level TM_initial. Since the outputs of the test mode control unit 60 TestMode<0>, TestMode<1>, . . . , TestMode<n> are held in a low level before operation of a test mode, the output of the NOR gate G1 is held in a high level. Therefore, a pass gate P1 is turned on, so that the multi-level test mode line 90 lies in a low level.

When one of the outputs of the test mode control unit 60 TestMode<0>, TestMode<1>, . . . , TestMode<n> is selected to perform the test operation, the corresponding output is changed into a high level.

For example, when TestMode<0> is in a high level, a pass gate P2 is turned on, so that Multi_level<0> is transmitted to the multi-level test mode line 90. When TestMode<1> is in a high level, a pass gate P3 is turned on, so that Multi_level<1> is transmitted to the multi-level test mode line 90. When TestMode<n> is in a high level, a pass gate Pn is turned on, so that Multi_level<n> is transmitted to the multi-level test mode line 90.

Figure 8:
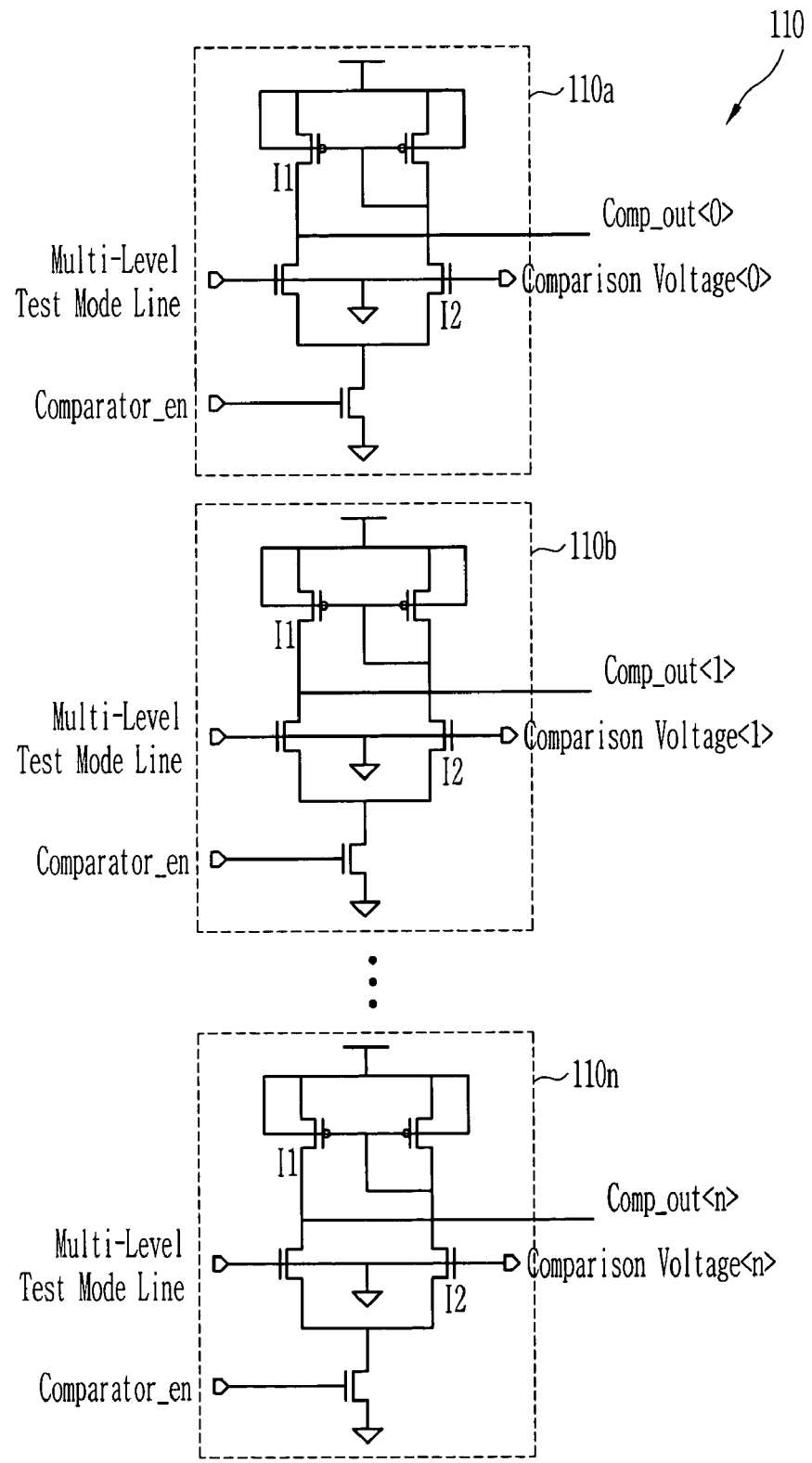
FIG. 8 is a detailed circuit diagram of a multi-level identifying unit in FIG. 4.

FIG. 8 is a detailed circuit diagram of the multi-level identifying unit 110 of FIG. 4.

The multi-level identifying unit 110 comprises a plurality of comparators 110a to 110n. Each comparator is enabled by an enabling signal Comparator_en. Further, first input terminals I1 of the comparators are connected to each other, and also connected to the multi-level test mode line 90. Comparison voltages with different magnitudes Comparison_Voltage<0>, Comparison_Voltage<1>, . . . , Comparison_Voltage<n> are applied to second input terminals I2 of the comparators, respectively. Each comparator compares the different levels and then outputs a low level or a high level. The comparison voltage may be obtained by using a method of allowing an external voltage to pass through a resistance divider and setting a voltage value, or a down level voltage used for other purpose may be used directly as the comparison voltage.

As a result, comparison outputs can be obtained by comparing the input multi levels with the comparison voltages of the comparators. Each comparison output Comp_out<0>, Comp_out<1>, . . . , Comp_out<n> of the comparators may be used directly in the test mode utilizing unit 100 or may be used after being decoded as shown in FIG. 9.

Figure 9:
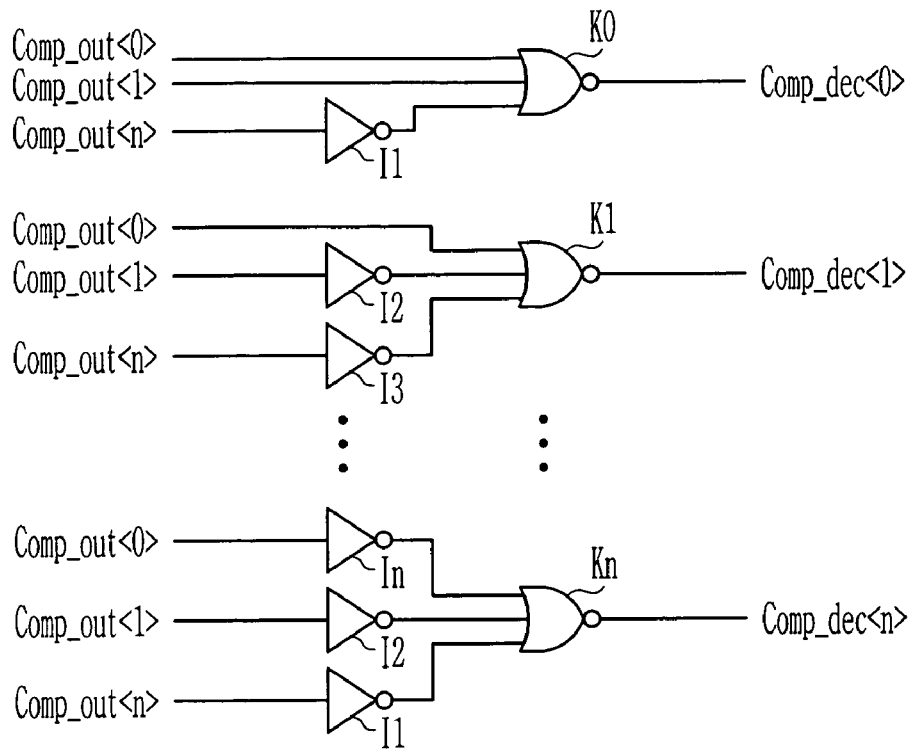
FIG. 9 is a detailed circuit diagram illustrating a coding circuit for decoding an output of a multi-level identifying unit in FIG. 8.

FIG. 9 is a circuit diagram of a decoding circuit for decoding the output of each comparator of FIG. 8.

The outputs of the comparators Comp_out<0>, Comp_out<1>, . . . , Comp_out<n> are inputted to a NOR gate K0. The output of the N-th comparator Comp_out<n> is inputted to the NOR gate K0 via the inverter I1. As a result, a decoding output Comp_dec<0> is generated.

The outputs of comparators Comp_out<0>, Comp_out<1>, . . . . Comp_out<n> are inputted to a NOR gate K1. The outputs of the N-th comparator Comp_out<n> and the (N−1)-th comparator Comp_out<n−1> are inputted to the NOR gate K1 via the inverters I1 and I2, respectively. As a result, a decoding output Comp_dec<1> is generated.

The outputs of comparators Comp_out<0>, Comp_out<1>, . . . . Comp_out<n> are inputted to a NOR gate Kn via the inverters I1 to In, respectively. As a result, a decoding output Comp_dec<n> is generated.

Figure 10:
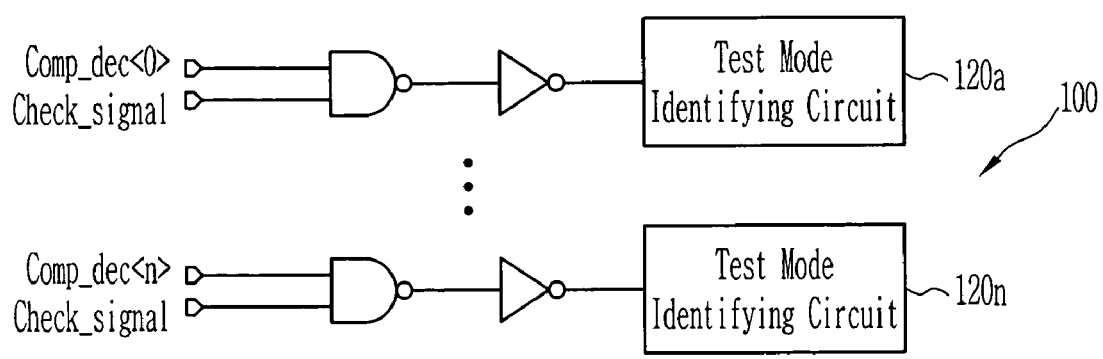
FIG. 10 is a detailed circuit diagram of a test mode utilizing unit in FIG. 4.

FIG. 10 is a detailed circuit diagram of the test mode utilizing unit 100 of FIG. 4.

A checking signal Check_signal is supplied to the respective test mode identifying circuits 120a, . . . , 120n via a NAND gate and an inverter in response to the decoding outputs Comp_out<0>, Comp_out<1>, . . . , Comp_out<n>. Each test mode is executed by the test mode identifying circuit.

Now, a method of generating multi levels will be explained using an example.

When generating multi levels in the multi-level generating unit 80 by using a method in which an external voltage is divided through a resistance divider to set voltage values, the level of the multi-level test mode line 90 is set to 2.0V, 1.5V, and 1.0V, respectively, when the external voltage is 2.5V. The comparison voltages of the multi-level identifying unit 110 are set to 1.75V, 1.25V, and 0.75V, respectively.

At that time, when a desired address code is inputted, one of the predetermined multi levels is transmitted. When the selected multi level is, for example, 1.0V, the comparator outputs of the multi-level identifying unit 110 is changed from Low, Low and Low into Low, Low and High, respectively, as shown in Table 1.

TABLE 1

| Multi level | Comparison voltatage<0> = 1.75 V | Comparison voltatage<1> = 1.75 V | Comparison voltatage<2> = 1.75 V |
|---|---|---|---|
| 1.0 V | Low | Low | High |
| 1.5 V | Low | High | High |
| 2.0 V | High | High | High |

As described above, in conventionally using a test mode, one test mode line was assigned for one test mode, so that it was difficult to use more test modes due to the limited space. However, according the present invention, it is possible to increase the number of test modes due to use of a multi-level test mode, so that a time for product development can be shortened and the chip size can be reduced.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A test mode circuit of a semiconductor device, comprising:
    a test mode control unit for generating a test mode control signal which is decoded in response to a plurality of address codes corresponding to kinds of test modes, respectively;
    a multi-level generating unit for generating multi levels;
    a multi-level transfer unit for loading the multi levels on one multi-level test mode line in response to a control signal from the test mode control unit; and
    a multi-level identifying unit for identifying the multi levels to be inputted from the multi-level transfer unit, to supply a generated test signal to a test mode utilizing circuit.

2. The test mode circuit of a semiconductor device according to claim 1, further comprising a decoding circuit for decoding the test signal to supply the decoded test signal to the test mode utilizing circuit.

3. The test mode circuit of a semiconductor device according to claim 1, wherein the test mode control unit comprises a plurality of latches for latching the respective address codes in response to a test start signal.

4. The test mode circuit of a semiconductor device according to claim 1, wherein the multi-level generating unit comprises a resistance divider using an external voltage.

5. The test mode circuit of a semiconductor device according to claim 1, wherein the multi-level generating unit is able to use a down level which is already being used for other purpose in the semiconductor device.

6. The test mode circuit of a semiconductor device according to claim 1, wherein the multi-level transfer unit comprises:
    an initializing signal generating circuit for generating an initializing signal in accordance with a plurality of test mode control signals from the test mode control unit;
    an initializing circuit for making the multi-level test mode line be set to a predetermined level in response to the initializing signal; and
    a transfer circuit for selectively transferring the multi levels to the multi-level test mode line in accordance with the plurality of test mode control signals.

7. The test mode circuit of a semiconductor device according to claim 6, wherein the initialing signal generating circuit comprises a NOR gate.

8. The test mode circuit of a semiconductor device according to claim 6, wherein the transfer circuit comprises a plurality of transmission gates.

9. The test mode circuit of a semiconductor device according to claim 1, wherein the multi-level identifying unit comprises a plurality of comparators.

* * * * *

UNITED STATES PATENT AND TRADEMARK OFFICE
CERTIFICATE OF CORRECTION

PATENT NO. : 6,949,947 B2 Page 1 of 1
APPLICATION NO. : 10/745280
DATED : September 27, 2005
INVENTOR(S) : Ho D. Jung It is certified that error appears in the above-identified patent and that said Letters Patent is hereby corrected as shown below:

At column 6, line 18, "initialing" should be --initializing--.

Signed and Sealed this

Twenty-first Day of November, 2006

JON W. DUDAS
*Director of the United States Patent and Trademark Office*